United States Patent [19]
Maeda et al.

[11] Patent Number: 5,231,058
[45] Date of Patent: Jul. 27, 1993

[54] PROCESS FOR FORMING CVD FILM AND SEMICONDUCTOR DEVICE

[75] Inventors: Kazuo Maeda; Noboru Tokumasu; Yuko Nishimoto, all of Tokyo, Japan

[73] Assignee: Semiconductor Process Laboratory Co. Ltd., Tokyo, Japan

[21] Appl. No.: 628,237

[22] Filed: Dec. 14, 1990

[30] Foreign Application Priority Data

Dec. 27, 1989 [JP] Japan .................................. 1-339071

[51] Int. Cl.$^5$ ........................................... H01L 21/02
[52] U.S. Cl. .................................... 437/235; 437/238; 437/982; 437/985; 156/646; 156/653; 156/654; 156/657
[58] Field of Search ............... 437/238, 243, 240, 235; 148/DIG. 118, DIG. 133; 427/255.3

[56] References Cited

U.S. PATENT DOCUMENTS 5,028,566  7/1991  Lagendijk .......................... 437/238

FOREIGN PATENT DOCUMENTS 0286097  10/1988  European Pat. Off. .

OTHER PUBLICATIONS

Chemical Abstracts 112(8): 67888v (1989).
NEC Research and Development, No. 94, Jul. 1989, Tokyo JP pp. 1-7.

Primary Examiner—Olik Chaudhuri
Assistant Examiner—H. Jey Tsai
Attorney, Agent, or Firm—Sprung Horn Kramer & Woods

[57] ABSTRACT

In a process for forming a CVD film, a polysiloxane compound having at least two silicon-oxygen bonds is reacted with ozone to form an $SiO_2$ film. If desired, the reaction may be effected in the presence of a gas containing an impurity mixed with the polysiloxane compound and ozone to form a PSG, BSG or BPSG film. In a semiconductor device, the $SiO_2$ film, or the PSG, BSG or BPSG film is used as a planarizing film, an interlayer insulating film, or a cover insulating film.

2 Claims, 6 Drawing Sheets

OMCTS PROCESS ($O_3$ CONCENTRATION 4%)

FIG·5

SiH₄-O₂ PROCESS

PLASMA PROCESS

TEOS PROCESS
(O₃ CONCENTRATION 0.6%)

TEOS PROCESS
(O₃ CONCENTRATION 4%)

OMCTS PROCESS
(O₃ CONCENTRATION 0.6%)

OMCTS PROCESS
(O₃ CONCENTRATION 4%)

PROCESS FOR FORMING CVD FILM AND SEMICONDUCTOR DEVICE

BACKGROUND OF THE INVENTION

1. Field of the Invention

The present invention relates to a process for forming a CVD (chemical vapor deposition) film and a semiconductor device, and more particularly to a process for forming an insulating film such as an $SiO_2$ film according to a CVD method and a semiconductor device using such a CVD film.

The multi-layer wiring technology has been in progress as a powerful means for increasing the scale of integration of semiconductor devices. In keeping with this, development of a method of forming an interlayer insulating film which is most adaptable for a multi-layer wiring structure has been increasingly in demand. In order to eliminate disconnection of metalic wirings because of stress migration and minimize the strain of devices and the like because of thermal stress, there has recently been a demand for development of a process capable of forming an interlayer insulating film at as low a temperature as possible.

2. Prior Art

Various proposals have heretofore been made of processes for forming an $SiO_2$ film according to a chemical vapor deposition method (hereinafter referred to as a "CVD method"), among which representative processes capable of forming an $SiO_2$ film at a low temperature in particular include those mentioned below.

(1) $SiH_4$—$O_2$ Process

This is a process for depositing an $SiO_2$ film on a semiconductor substrate at a temperature of 350° to 450° C. according to a reaction represented by the following formula: $SiH_4 + SiO_2 \rightarrow SiO_2 + 2H_2$. This reaction occurs in a gaseous phase, and hence an $SiO_2$ film is formed through simple deposition.

According to this process, a large number of particles are liable to be generated to deteriorate the quality of the resulting film and liable to give rise to uptake of moisture into the film, presenting a problem of poor reliability. Furthermore, the poor step coverage of the film entails a problem of disconnection of wirings formed on the film. Moreover, special care must be taken of $SiH_4$ as a reactive gas to be used in the reaction because of its self-burning properties. This makes the handling of $SiH_4$ complicated (2) Plasma CVD Process Using $SiH_4$-$N_2O$ or Like This method is advantageous in that an $SiO_2$ film can be formed at a temperature as low as 300° to 400° C. However, since it is a film formation process utilizing charged particles, damage to a device is so great that the process is unsuitable for use in production of very fine devices and VLSI structures. Furthermore, plasma discharge is so liable to break down all kinds of chemical bonds that a good-quality film can not always be obtained. Moreover, the process involves generation of a large number of particles and a great possibility that metallic atoms and the like constituting the inside of a reaction chamber used in the process may be incorporated into the resulting film to cause contamination of the film. In addition, the film obtained by the process has a problem of poor step coverage.

(3) TEOS-$O_3$ Process

This is a process wherein TEOS (tetraethyl ortho-silicate, $Si(OC_2H_5)_4$, an alkoxysilane) is decomposed with the aid of $O_3$ (ozone) to form an $SiO_2$ film.

This method has various advantages such as safety of TEOS, good step coverage, little generation of partices, and other merits in association with the reaction rate determination of surface. Accordingly, this process can eliminate the defects of the above-mentioned $SiH_4$-$O_2$ process (1) and plasma CVD process using $SiH_4$-$N_2O$ and the like (2).

In accordance with the process for forming an $SiO_2$ film according to the TEOS-$O_3$ reaction, however, the deposition rate of an $SiO_2$ film is dependent upon the $O_3$ concentration, while the film quality thereof is not always satisfactory and the step coverage of the film around stepped portions of the underlying surface turns from flowing profiles into isotropic profiles as the $O_3$ concentration is decreased (about 3 mol % or less). This entails a difficulty in using such $SiO_2$ films as interlayer insulating films.

Furthermore, when the underlying surface is of a thermal $SiO_2$ film, the unevenness, or roughness, of the surface of an $SiO_2$ film formed thereon by the TEOS-$O_3$ process increases with an increase in the $O_3$ concentration to increase the possibility of causing failures such as disconnection of wirings.

Moreover, the TEOS-$O_3$ reaction involves a high possibility of particle generation because it is not necessarily a perfect surface reaction.

Thus, in accordance with the process for forming an $SiO_2$ film according to the TEOS-$O_3$ reaction, the film quality, the step coverage, the film surface state, the film deposition rate, etc. are so dependent upon the $O_3$ concentration that $SiO_2$ films cannot always be formed stably.

The present invention has been made in view of the foregoing problems of the prior art. Accordingly, an object of the present invention is to provide a novel CVD process easy of production control with a constant deposition rate and capable of forming a good-quality CVD film with good step coverage and other characteristics.

SUMMARY OF THE INVENTION

In accordance with the present invention, there is provided a process for forming a CVD film, comprising reacting a polysiloxane compound having at least two silicon-oxygen bonds with ozone to form an $SiO_2$ film.

Examples of the polysiloxane compound having at least two silicon-oxygen bonds include linear siloxane compounds represented by the following formula:

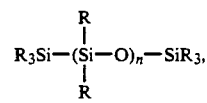

which include hexamethyldisiloxane.

Other examples of the polysiloxane compounds having at least two silicon-oxygen bonds include cyclic siloxane compounds represented by the following formula:

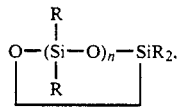

which include octamethylcyclotetrasiloxane (OMCTS) represented by the following molecular formula:

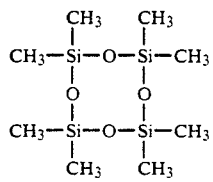

and hexamethylcyclotrisiloxane.

In the above-mentioned formulae, R stands for an alkyl group which includes no hydrophilic substituent groups such as —OH,

—CHO, and

provided that a number of R groups in one compound molecule may be the same or different.

When a PSG film, a BSG film or a BPSG film is to be formed by the CVD process of the present invention, the above-mentioned polysiloxane compound having at least two silicon-oxygen bonds is mixed with a gas containing an impurity such as phosphorus or boron to be reacted with ozone.

The CVD process of the present invention has the following features:

(1) The reaction does not occur in a gaseous phase, but mainly on the underlying surface. This results in very little generation of particles. Additionally stated, although film deposition occurs on a heater, a susceptor, etc., the deposited films are very dense not in a flaky form to fail as particle generation sources.

(2) Good-quality films having the following properties can be obtained stably without any dependence on the $O_3$ concentration.

(a) The moisture content of the films is low with little moisture absorption.

(b) The insulating properties of the films are good with little leak current.

(c) The shrinkage of the films is low with low tensile stress.

(d) The etching rate of the films is constant.

(3) The step coverages of the films are in a flowing profile and any deep grooves can be filled up with the films without formation of voids. This is an advantage over any conventional processes.

(4) The film deposition rate can be raised as compared with that in the case of the conventional TEOS-$O_3$ process (TEOS includes one Si-O bond in one molecule thereof.) because the polysiloxane compound to be used in the present invention includes at least two Si-O bonds in one molecule thereof.

BRIEF DESCRIPTION OF THE DRAWINGS

The foregoing and other objects, features and advantages of the present invention will be better understood from the following description taken in connection with the accompanying drawings, in which.

DESCRIPTION OF PREFERRED EMBODIMENTS

Figure 1:
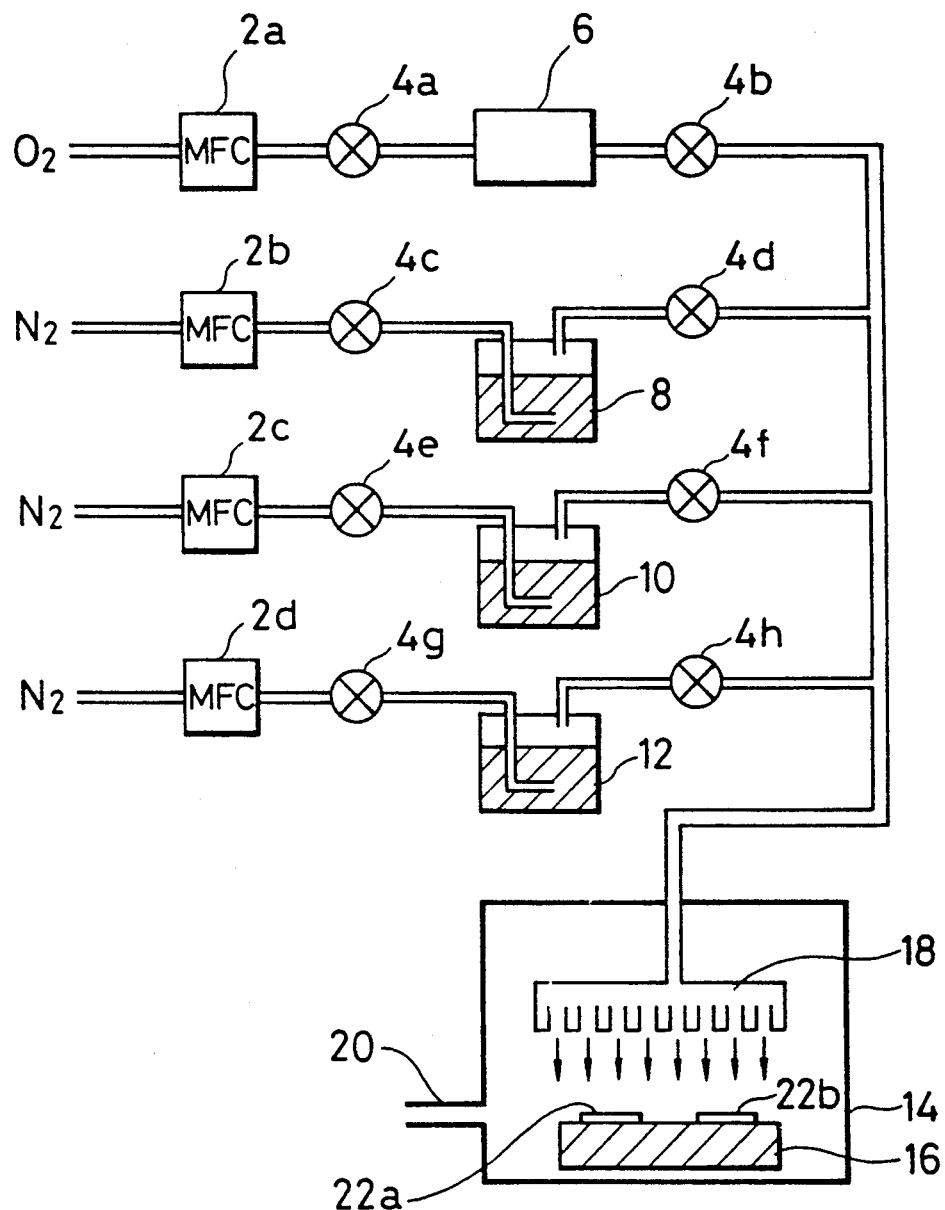
FIG. 1 is a schematic illustration of production equipment for use in a CVD process in Example according to the present invention.

FIG. 1 is a schematic illustration of production equipment for use in the CVD process of Example according to the present invention, which will be given later.

The equipment of FIG. 1 comprises mass flow controllers (MFC) 2a to 2d, valves 4b to 4h, an ozone generator 6 wherein oxygen ($O_2$) is converted into ozone ($O_3$), a resorvoir 8 wherein a solution of OMCTS (octamethylcyclotetrasiloxane) is kept at a temperature of about 40° to 65° C., a resorvoir 10 wherein a solution of TMPO (trimethyl phosphate) is kept at a temperature of about 50° to 60° C., a resorvoir 12 wherein a solution of TEB (triethyl borate) is kept at a temperature of about 5° to 50° C., and a CVD chamber 14.

The chamber 14 includes a heater 16, a gas outflow head 18, and a gas discharge outlet 20. Wafers 22a and 22b as substrates for film formation thereon is in place in the chamber 14.

The procedure of forming an $SiO_2$ film using the equipment of FIG. 1 is as follows. The valves 4a to 4d are opened. This entails generation of $O_3$ gas in the ozone generator 6, from which the $O_3$ gas is fed into the chamber 14 through the gas inflow head 18, through which OMCTS gas on a carrier gas $N_2$ is also fed into the chamber 14. The ensuing OMCTS-$O_3$ reaction forms $SiO_2$ films on the wafers 22a and 22b.

When PGS films are to be formed, the valves 4a to 4f are opened. This entails feeding, into the chamber 14, of $O_3$ gas as well as OMCTS and TMPO gases on a carrier gas $N_2$. The ensuing OMCTS-TMPO-$O_3$ reaction forms PSG films on the wafers 22a and 22b.

When BSG films are to be formed, the valves 4a to 4d, 4g and 4h are opened. This entails feeding, into the chamber 14, of $O_3$ gas as well as OMCTS and TEB gases on a carrier gas $N_2$. The ensuing OMCTS-TEB-$O_3$ reaction forms BSG films on the wafers 22a and 22b.

When BPSG films are to be formed, the valves 4a to 4h are opened. This entails feeding, into the chamber 14, of $O_3$ gas as well as OMCTS, TMPO and TEB gases on a carrier gas $N_2$. The ensuing OMCTS-TMPO-TEB-$O_3$ reaction forms BPSG films on the wafers 22a and 22b.

EXAMPLE

Example according to the present invention will now be described while referring to the accompanying drawings.

FIGS. 2 to 6 are diagrams showing the results of experiments on $SiO_2$ films formed by the CVD process of the present invention.

(1) Deposition Rate

Figure 2:
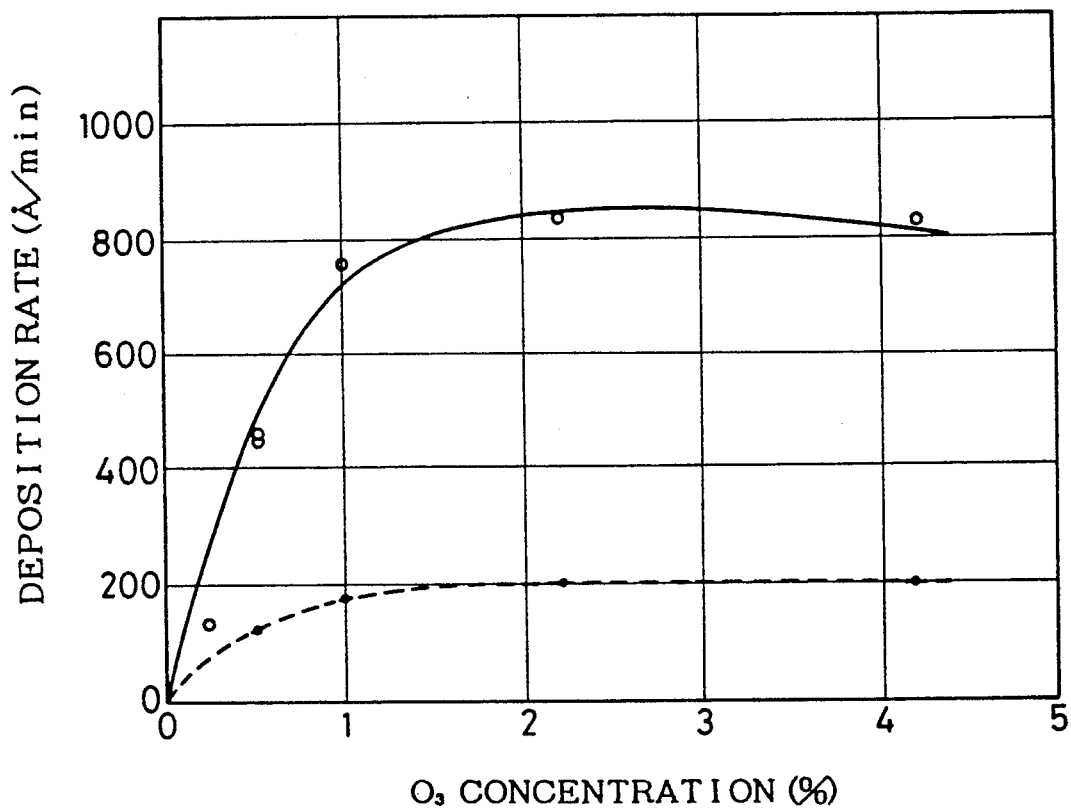
FIG. 2 is a diagram showing a variation of deposition rate with ozone concentration.

FIG. 2 is a diagram showing the relationship between the $O_3$ concentration and the $SiO_2$ film deposition rate, wherein the abscissa represents the $O_3$ concentration (mol %) while the ordinate represents the deposition rate (Å/min). The temperature of the wafers (substrates) was 400° C. and the temperature of the OMCTS solution (source temperature) was 40° C. The flow rate of the carrier gas $N_2$ was 4.0 SLM (standard liter/min).

In the figure, marks of white circle indicate that the underlying surface was of an Si film, while marks of black circle indicate that the underlying surface was of a thermal $SiO_2$ film. In either case, the deposition rate was substantially constant and stable when the $O_3$ concentration was 1 mol % or more. This will prove that an $O_3$ concentration of about 1 mol % or more can facilitate the production process control.

Under the same process conditions, the deposition rate in the process of the present invention was compared with that in the conventional TEOS-$O_3$ process.

Process Conditions (a) substrate temperature: 400° C.

(b) source temperature: 65° C. (saturated vapor pressure: 20 mmHg)

(c) $O_3$ concentration: 40,000 ppm (by mol)

(d) flow rate of carrier gas $N_2$:3.5 SLM

Under the above-mentioned conditions, the deposition rate in the conventional TEOS-$O_3$ process was 1,000 Å/min, whereas the deposition rate in the OMCTS-$O_3$ process according to the present invention was 2,2000 Å/min.

Thus, according to the present invention, the deposition rate is at least two times as high as that in the conventional TEOS-$O_3$ process to be able to improve the throughput.

(2) Etching Rate

Figure 3:
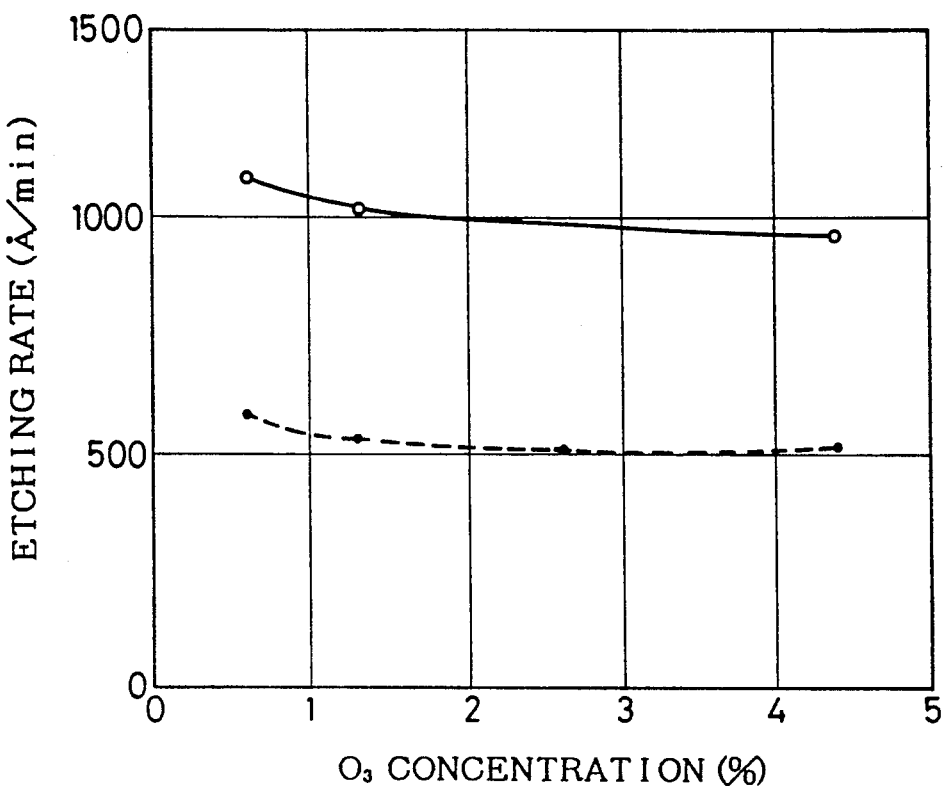
FIG. 3 is a diagram showing a variation of etching rate of $SiO_2$ film with ozone concentration.

FIG. 3 is a diagram showing the relationship between the $O_3$ concentration (mol %) and the etching rate (Å/min) of $SiO_2$ film formed by the CVD process of the present invention.

In the figure, marks of white circle indicate that the underlying surface was of an Si film, while marks of black circle indicate that the underlying surface was of a thermal $SiO_2$ film. In either case, the etching rate was substantially constant and stable when the $O_3$ concentration was 1 mol % or more. This will prove that an $O_3$ concentration of about 1 mol % or more can facilitate the control of an operation of etching an $SiO_2$ film into a patterned film.

(3) Shrinkage

Figure 4:
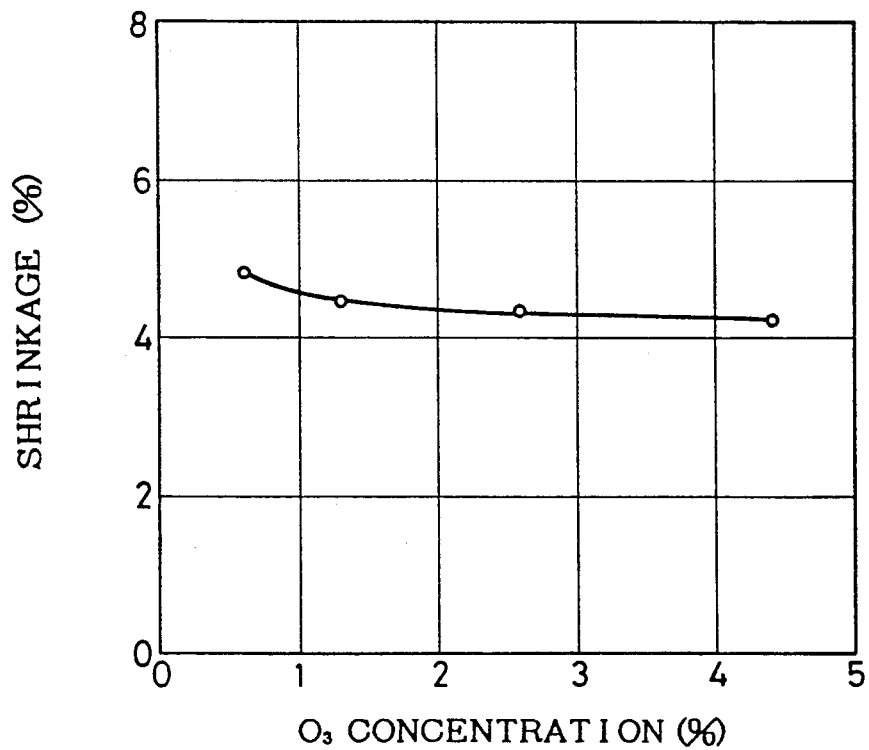
FIG. 4 is a diagram showing a variation of shrinkage of $SiO_2$ film with ozone concentration.

FIG. 4 is a diagram showing the relationship between the $O_3$ concentration (mol %) and the shrinkage (%) of $SiO_2$ film formed by the CVD process of the present invention. The shrinkage was examined through measurement of respective film thicknesses before and after annealing (at 850° C., for 30 sec, under $N_2$). In this case as well, no substantial dependence of film shrinkage on $O_3$ concentration was recognized. Furthermore, a very low level of film shrinkage will prove that the films were dense and of good quality.

(4) Stress

Figure 5:
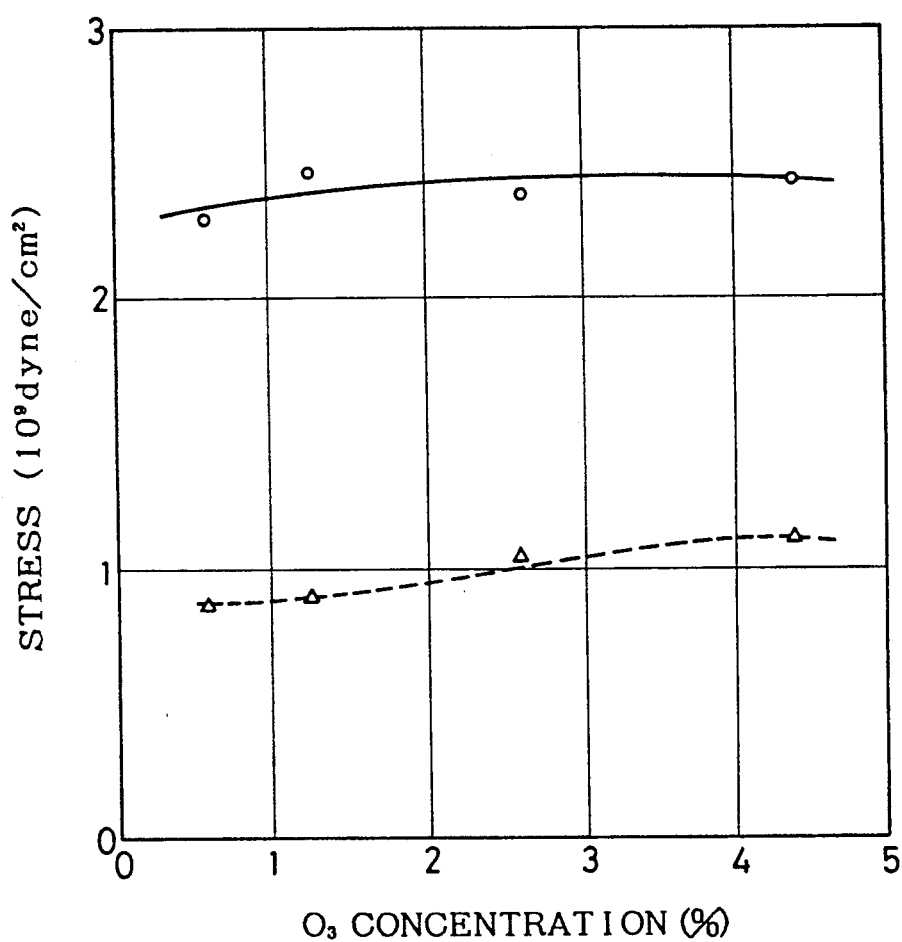
FIG. 5 is a diagram showing a variation of stress of $SiO_2$ with ozone concentration.

FIG. 5 is a diagram showing the relationship between the $O_3$ concentration and the stress of $SiO_2$ film formed by the CVD process of the present invention, wherein the abscissa represents the $O_3$ concentration (mol %) while the ordinate represents the stress ($10^9$ dyne/cm$^2$) with time being a parameter. In the figure, marks of white circle indicate that the stress was examined immediately after film deposition, while marks of white triangle indicate that the stress was examined 24 hours after the film deposition. The stress was examined through measurement of film warping.

In actual wafer processing, the value of stress examined a while after film deposition is of more significance than that examined immediately after the film deposition. In this case as well, the dependence of stress on $O_3$ concentration was low, and the stress values were on a low level.

(5) Moisture Content

Figure 6:
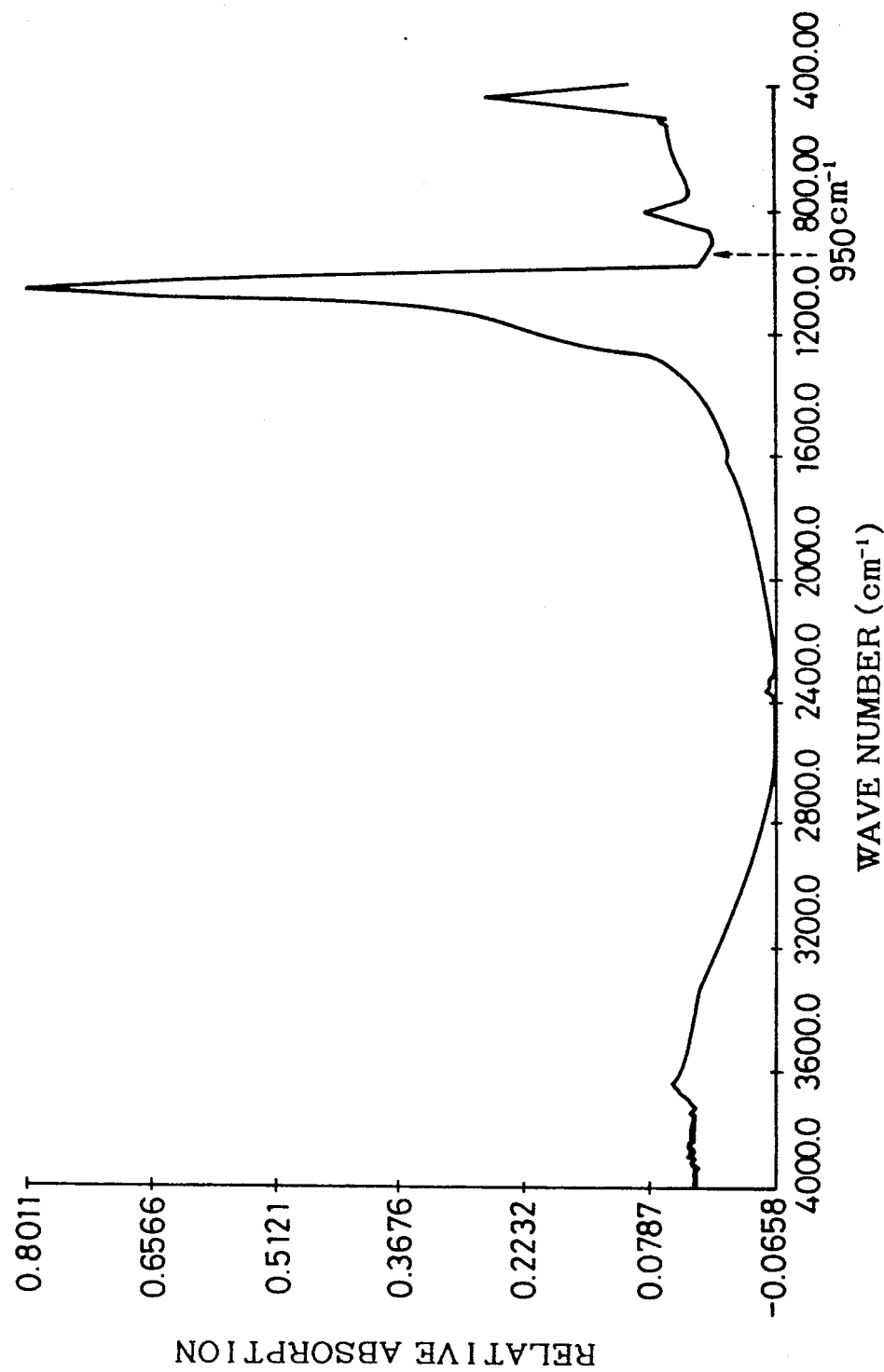
FIG. 6 is a diagram showing an infrared absorption curve indicative of the OH group content of an $SiO_2$.
Figure 7A:
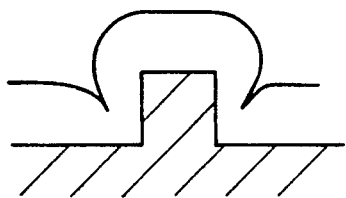
FIG. 7a-7d are an illustration comparing the step coverage of an $SiO_2$ film formed according to the process of the present invention with those of $SiO_2$ films formed according to conventional processes.
Figure 7B:
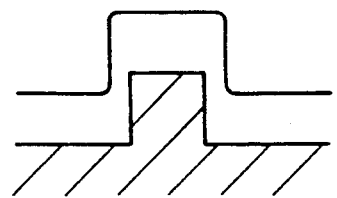
Figure 7C:
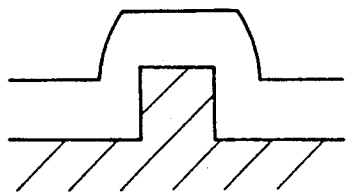
Figure 7D:
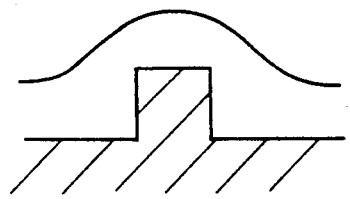
Figure 7E:
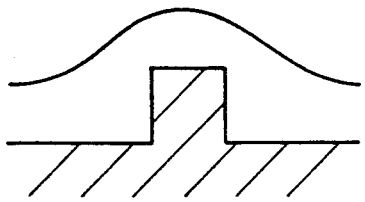
Figure 7F:
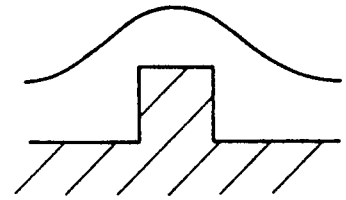

FIG. 6 is a diagram showing an infrared absorption curve of an $SiO_2$ film formed by the CVD process of the present invention, wherein the abscissa represents the wavenumber (cm$^{-1}$) of infrared rays while the ordinate represents the relative absorption, the absolute values of which do not have any special meaning.

This curve is indicative of the moisture content of the $SiO_2$ film. More specifically, the absorption at around 950 cm$^{-1}$ is assigned to OH groups constituting water molecules ($H_2O$). The very low absorption at around 950 cm$^{-1}$ in the curve will prove that the $SiO_2$ film had a low moisture content and was of good quality with low moisture absorption.

(6) Coverage

FIGS. 7 (a) to (f) compares the coverage, around a stepped portion, of an $SiO_2$ film formed by the CVD process of the present invention with those of $SiO_2$ films formed by conventional CVD processes. Such stepped portions of the underlying surface are formed when electrodes and wirings are formed.

FIG. 7 (a) illustrates the coverage of an $SiO_2$ film formed by the conventional $SiH_4$-$O_2$ process, which includes constrictions around stepped portions of the underlying surface to give rise to liability to disconnection of wirings formed thereon. FIG. 7 (b) illustrates the coverage of an $SiO_2$ film formed by a conventional plasma process, which includes a faithful reflection of the shapes of stepped portions of the underlying surface to give rise to a downgraded reliability of wirings formed thereon.

FIG. 7 (c) illustrates the coverage of an $SiO_2$ film formed at an $O_3$ concentration of 0.6 mol % by the conventional TEOS-$O_3$ process, which is in an isotropic deposition profile and includes a reflection of the shapes of stepped portions of the underlying surface to give rise to liability to disconnection of wirings formed thereon.

FIG. 7 (d) illustrates the coverage of an $SiO_2$ film deposited at an $O_3$ concentration of 4 mol % by the conventional TEOS-$O_3$ process, which is in a flowing profile, but involves a possibility of sometimes entailing a downgraded reliability of wirings formed thereon.

FIGS. 7 (e) and (f) illustrate the respective coverages of $SiO_2$ films deposited at $O_3$ concentrations of 0.6 mol % and 4 mol %, respectively, by the OMCTS-$O_3$ process of the present invention, which are in a flowing profile and hardly give rise to disconnection of wirings formed thereon.

As is apparent from the foregoing description, an SiO$_2$ film formed by the OMCTS-O$_3$ process of the present invention is always deposited in a flowing profile even around stepped portions of the underlying surface without any substantial dependence on the O$_3$ concentration to hardly give rise to liability to disconnection of wirings formed thereon. Accordingly, the process of the present invention is very effectively applicable to production of semiconductor devices with multi-layer wirings and the like.

The OMCTS-O$_3$ process according to the present invention was used at O$_3$ concentrations of 0.6 mol % and 4 mol % to form respective SiO$_2$ films around grooves having an aspect ratio of 5 (width: 0.8 μm, depth: 4 μm). The grooves were filled up with the respective SiO$_2$ films without formation of voids.

As described hereinbefore, the OMCTS-O$_3$ process according to the present invention is advantageous in that the film growth rate is high and substantially independent of the O$_3$ concentration as compared with conventional CVD processes, particularly the TEOS-O$_3$ process. This will advantageously raise the productivity and facilitate the production process control.

Furthermore, according to the present invention, the reaction occurs on the underlying surface to cause very little generation of particles. This can prevent a decrease in the yield of semiconductor devices, which would otherwise be attributable to particles, and can improve the reliability of semiconductor devices because of the high density and low moisture absorption of SiO$_2$ films formed by the process of the present invention.

An SiO$_2$ film formed by the process of the present invention can perfectly fill up a groove having even a high aspect ratio without formation of voids, and is in such a flowing profile even around angular parts of stepped portions of the underlying surface that wirings formed thereon hardly undergo disconnection.

Accordingly, when the CVD process of the present invention is used to form interlayer insulating films and the like, semiconductor devices with a highly reliable multi-layer wiring structure can be produced.

What is claimed is:

1. A process for forming a CVD film on a heated wafer comprising reacting a polysiloxane compound having at least two silicon-oxygen bonds with ozone, the polysiloxane compound being selected from the group consisting of linear siloxane compounds represented by the following formula:

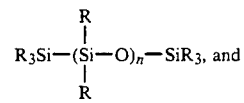

cyclic siloxane compounds represented by the following formula:

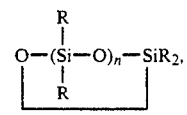

wherein R stands for an alkyl group which includes no hydrophilic substituent groups such as —OH,

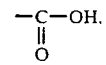

—CHO, and

provided that a number of R groups in one compound molecule may be the same or different.

2. The process according to claim 1, wherein the reaction of the polysiloxane compound with ozone is achieved in the presence of a gas containing at least one impurity selected from the group consisting of phosphorus and boron thereby to form a PSG, BSG or BPSG film.

* * * * *